US009736942B2

(12) United States Patent
Takagi

(10) Patent No.: US 9,736,942 B2
(45) Date of Patent: Aug. 15, 2017

(54) COIL COMPONENT, ITS MANUFACTURING METHOD, AND CIRCUIT SUBSTRATE PROVIDED WITH THE COIL COMPONENT

(71) Applicant: TDK Corporation, Tokyo (JP)

(72) Inventor: Nobuo Takagi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/211,967

(22) Filed: Jul. 15, 2016

(65) Prior Publication Data

US 2017/0053726 A1 Feb. 23, 2017

(30) Foreign Application Priority Data

Aug. 21, 2015 (JP) ................. 2015-163627

(51) Int. Cl.
*H05K 1/16* (2006.01)
*H05K 3/30* (2006.01)
*H01F 27/24* (2006.01)
*H01F 27/29* (2006.01)
*H01F 27/28* (2006.01)
*H05K 1/18* (2006.01)
*H05K 1/11* (2006.01)
*H01F 41/076* (2016.01)

(52) U.S. Cl.
CPC ............ *H05K 1/165* (2013.01); *H01F 27/24* (2013.01); *H01F 27/2823* (2013.01); *H01F 27/292* (2013.01); *H01F 41/076* (2016.01); *H05K 1/111* (2013.01); *H05K 1/16* (2013.01); *H05K 1/181* (2013.01); *H05K 3/30* (2013.01); *H05K 2201/09409* (2013.01); *H05K 2201/09427* (2013.01); *H05K 2201/1003* (2013.01)

(58) Field of Classification Search
CPC ............ H05K 1/16; H05K 1/165; H05K 3/30
See application file for complete search history.

(56) References Cited

FOREIGN PATENT DOCUMENTS

JP 2014-199906 10/2014

*Primary Examiner* — Jeremy C Norris
(74) *Attorney, Agent, or Firm* — Young Law Firm, P.C.

(57) ABSTRACT

Disclosed herein is a coil component that includes a drum-shaped core having a flange portion and a winding core around which a wire is wound. The flange portion includes first and second side surface opposite to each other, and a mounting surface. The mounting surface of the flange portion includes first and second convex portions and a concave portion positioned therebetween. The first convex portion has a third side surface parallel to the first side surface of the flange portion. The second convex portion has a fourth side surface parallel to the second side surface of the flange portion. A level difference between the first side surface and the third side surface is larger than a level difference between the second side surface and the fourth side surface.

13 Claims, 15 Drawing Sheets

COIL COMPONENT, ITS MANUFACTURING METHOD, AND CIRCUIT SUBSTRATE PROVIDED WITH THE COIL COMPONENT

BACKGROUND OF THE INVENTION

Field of the Invention

The present invention relates to a coil component and its manufacturing method and, more particularly, to a coil component using a drum-shaped core and its manufacturing method. The present invention further relates to a circuit substrate and, more particularly, to a circuit substrate provided with the coil component using the drum-shaped core.

Description of Related Art

In recent years, electronic components used in an information terminal device such as a smartphone is strongly required to be reduced in size and height. Under such circumstances, a large number of surface mount coil components such as a pulse transformer using a drum-shaped core, not a toroidal-shaped core are used. For example, Japanese Patent Application Laid-Open No. 2014-199906 discloses a surface mount pulse transformer using the drum-shaped core.

In the drum-shaped core of the pulse transformer described in Japanese Patent Application Laid-Open No. 2014-199906, a mounting surface of a flange portion of the core has a concavo-convex shape, and a wire end portion is connected to a convex portion (see FIG. 2 of Japanese Patent Application Laid-Open No. 2014-199906). Each flange portion has four convex portions, and side surfaces of the four convex portions positioned at both ends of the core coincide with side surfaces of the flange portions.

However, when a plurality of pulse transformers described in Japanese Patent Application Laid-Open No. 2014-199906 are mounted on a circuit substrate in proximity, a distance between the adjacent pulse transformers is too small, which may deteriorate reliability. In particular, when a part of the terminal electrode is formed also on the side surface of each convex portion, a solder fillet is formed on the side surface of each convex portion, with the result that the above problem becomes more prominent.

The above problem is not a problem that occurs only in the pulse transformer, but a problem occurs commonly in coil components using the drum-shaped core.

SUMMARY

An object of the present invention is therefore to provide a coil component capable of ensuring reliability even when a plurality of the coil components are mounted on a circuit substrate in proximity and a manufacturing method for the coil component.

Another object of the present invention is to provide a circuit substrate on which such coil components are mounted.

A coil component according to the present invention includes: a drum-shaped core having a pair of flange portions and a winding core positioned between the pair of flange portions; a plurality of terminal electrodes formed in each of the flange portions; and plurality of wires wound around the winding core and having a plurality of end portions connected to their corresponding terminal electrodes. The flange portion has a mounting surface parallel to an axial direction of the winding core and first and second side surfaces parallel to the axial direction of the winding core and to each other. The mounting surface has a plurality of convex portions and a concave portion positioned between the plurality of convex portions. The terminal electrodes are each formed at least on the convex portion, and thus the terminal electrodes formed on the mounting surface are isolated by the concave portion. Out of the plurality of convex portions, a first convex portion closest to the first side surface is parallel to the first side surface and has a third side surface positioned at the first side surface side. Out of the plurality of convex portions, a second convex portion closest to the second side surface is parallel to the second side surface and has a fourth side surface positioned at the second side surface side. A level difference between the first side surface and the third side surface is larger than a level difference between the second side surface and the fourth side surface.

A circuit substrate according to the present invention includes a substrate having a plurality of land patterns, the above-described coil component mounted on the circuit substrate, and a solder connecting the plurality of land patterns and the plurality of terminal electrodes.

According to the present invention, a level difference is formed at the side surface of the flange portion, making it difficult for a terminal electrode of one coil component to be short-circuited to a terminal electrode of another coil component. This can increase reliability of a product. For example, even in a case where two coil components are mounted on the substrate such that the first side surface of one coil component and the second side surface of the other coil component face each other, a sufficient distance can be ensured between both the terminal electrodes. In addition, a level difference between the second side surface and the fourth side surface is relatively small, so that a size of the coil component is not increased more than necessary.

In the present invention, preferably the terminal electrode is further formed at the third and fourth side surfaces. In this case, a solder fillet is formed at the third and fourth side surfaces, the above-described short circuit is likely to occur; however, high reliability can be ensured even in this case.

In the present invention, preferably the second side surface and the fourth side surface form the same plane. This can reduce a size of the coil component.

In the present invention, preferably the drum-shaped core has a two-fold rotation-symmetrical shape. With this configuration, the coil component has no directivity, thus facilitating mounting work.

In the present invention, it is preferable that the plurality of convex portions further includes third and fourth convex portions, that the first, third, fourth, and second convex portions are arranged in this order, and that the plurality of terminal electrodes include first, second, third, and fourth electrodes formed respectively on the first, second, third, and fourth convex portions. With this configuration, the coil component can be used as a pulse transformer.

In this case, preferably a gap between the third and fourth convex portions is larger than a gap between the first and third convex portions and a gap between the second and four convex portions. This can increase a breakdown voltage between primary and secondary sides. When the second and fourth terminal electrodes are used as a center tap, a common land pattern may be provided on the substrate for the second and fourth terminal electrodes. In this case, more preferably the second and fourth terminal electrodes are short-circuited via a bridge of the solder. This allows reliable short circuit of the center tap.

Further, in this case, preferably the gap between the first and third convex portions and the gap between the second and fourth convex portions differ from each other. This facilitates the short circuit of the center tap.

The first, second, third, and fourth terminal electrodes are preferably formed on side surfaces of the respective first, second, third, and fourth convex portions. Assuming that the gap between the first and third convex portions or the gap between the second and fourth convex portions is a, and a height of each of the first, second, third, and fourth terminal electrodes formed on the side surfaces of respective first, second, third, and fourth convex portions is b, $b/a \geq 1/3$ is preferably satisfied. Satisfying this condition facilitates formation of the solder bridge.

A coil component manufacturing method include a first process of preparing a drum-shaped core having a pair of flange portions and a winding core positioned between the pair of flange portions, a second process of forming a plurality of terminal electrodes on each of the flange portions, and a third process of winding a plurality of wires around the winding core and connecting end portions of the wire to their corresponding terminal electrodes. The flange portion has a mounting surface parallel to an axial direction of the winding core and first and second side surfaces parallel to the axial direction of the winding core and to each other. The mounting surface has a plurality of convex portions and a concave portion positioned between the plurality of convex portions. Out of the plurality of convex portions, a first convex portion closest to the first side surface is parallel to the first side surface and has a third side surface positioned at the first side surface side. Out of the plurality of convex portions, a second convex portion closest to the second side surface is parallel to the second side surface and has a fourth side surface positioned at the second side surface side. A level difference between the first side surface and the third side surface is larger than a level difference between the second side surface and the fourth side surface. The second process prepares an electrode material in a liquid or paste form and dips the convex portions in the electrode material such that the concave portions is not brought into contact with the electrode material.

With the above procedure, the terminal electrode can be easily formed on the convex portion.

As described above, according to the present invention, there can be provided a coil component capable of ensuring reliability even when a plurality of the coil components are mounted on a substrate in proximity and a manufacturing method for the coil component. Further, there can be provided a circuit substrate on which such coil components are mounted.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
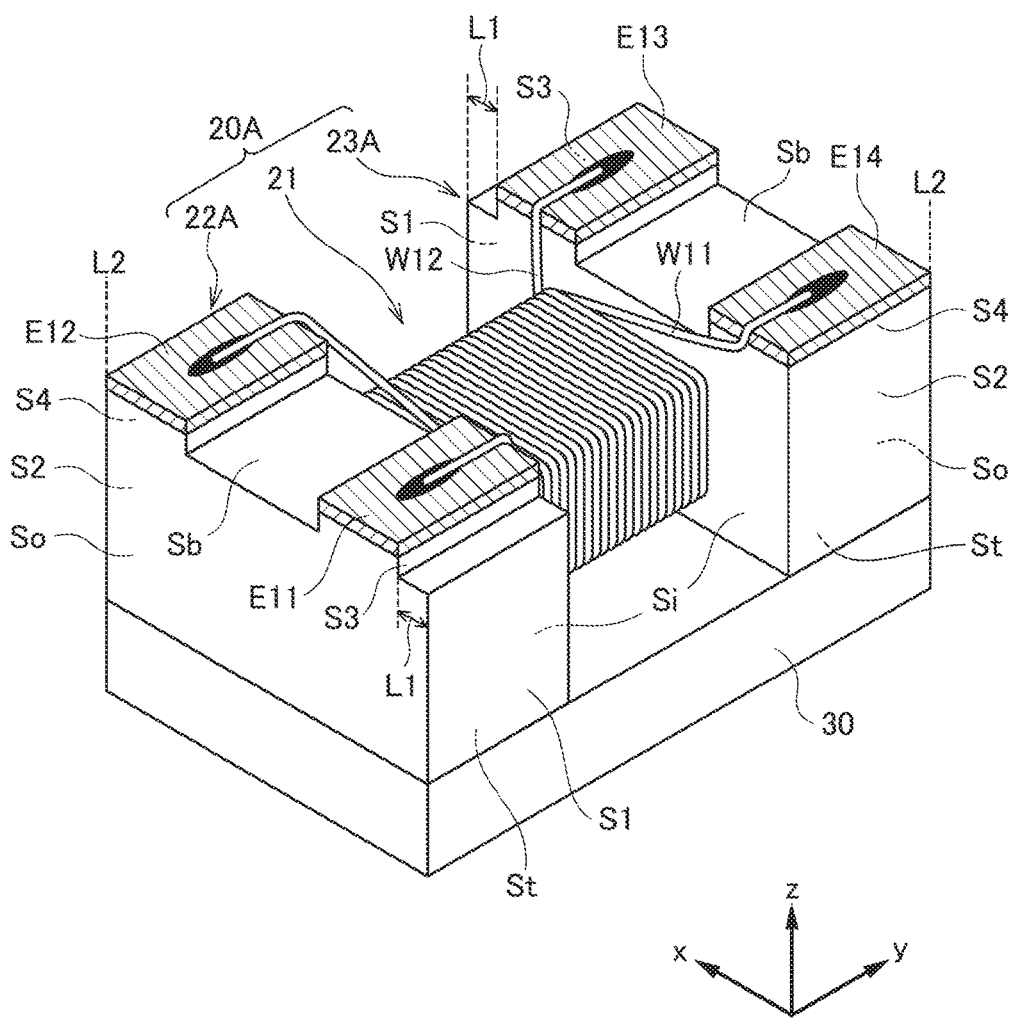
FIG. 1 is a schematic perspective view illustrating an external appearance of a coil component according to a first embodiment of the present invention.

FIG. 1 is a schematic perspective view illustrating an external appearance of a coil component 10A according to a first embodiment of the present invention.

The coil component 10A according to the present embodiment is a surface mount coil component and includes, as illustrated in FIG. 1, a drum-shaped core 20A, a plate-like core 30 bonded to the drum-shaped core 20A, and two wires W11 and W12 wound around a winding core 21 of the drum-shaped core 20A. Use of the coil component 10A according to the present embodiment is not especially limited, and the coil component 10A may be used as a filter such as a common mode choke coil or as a transformer.

Each of the drum-shaped core 20A and the plate-like core 30 is formed of a magnetic material having a comparatively high permeability, such as an Ni—Zn ferrite sintered body or an Mn—Zn ferrite sintered body. The magnetic material having a high permeability, such as the Mn—Zn ferrite, generally has a low specific resistance and thus has conductivity.

The drum-shaped core 20A has a rod-like winding core 21 and a pair of flange portions 22A and 23A provided at axial direction (y-direction) both ends of the winding core 21. The winding core 21 and flange portions 22A and 23A are integrally formed. The flange portions 22A and 23A each have an inner surface Si connected to the winding core 21 and an outer surface So positioned at an opposite side to the inner surface Si. The inner surface Si and the outer surface So constitute an xz plane. The flange portions 22A and 23A further has a mounting surface Sb, a bonding surface St, a first side surface S1 and a second side surface S2. The mounting surface Sb and the bonding surface St extend in parallel and constitute an xy plane and. The first and second side surfaces S1 and S2 extend in parallel and constitute a yz plane.

The coil component 10A is a component that is surface-mounted on a printed circuit board in actual use with the mounting surface Sb of the flange portions 22A and 23A facing the printed circuit board. The plate-like core 30 is secured by adhesive to the bonding surfaces St of the respective flange portions 22A and 23A. With this configuration, a closed magnetic path is formed by the drum-shaped core 20A and the plate-like core 30.

As illustrated in FIG. 1, the mounting surface Sb of each of the flange portions 22A and 23A has a concavo-convex shape. More specifically, each of the flange portions 22A and 23A has two convex portions on the mounting surface Sb, and the two convex portions are separated by a concave portion. Terminal electrodes are formed respectively on top surfaces of the convex portions. Specifically, the flange portion 22A has two terminal electrodes E11 and E12, and the flange portion 23A has two terminal electrodes E13 and E14. The terminal electrodes E11 to E14 are formed by conductive films coated on the corresponding flange portions 22A and 23A. The conductive film is not coated on the concave portion. Thus, the plurality of terminal electrodes (e.g., E11 and E12) formed in the same flange portion are electrically isolated from each other by the concave portion having no conductive film.

As illustrated in FIG. 1, two wires W11 and W12 are wound around the winding core 21. One ends of the respective wires W11 and W12 are connected respectively to the terminal electrodes E11 and E12, and the other ends thereof are connected respectively to the terminal electrodes E14 and E13. The connection of the wires W11 and W12 is made on the convex portions of the mounting surface Sb. A method for the wire connection is not especially limited. For example, the wire connection can be made by thermo-compression bonding or laser bonding.

The terminal electrodes E11 to E14 are each formed not only on the top surface of the convex portion, but also on a part of each of side surfaces constituting the convex portion. That is, each convex portion has a side surface positioned at the inner surface Si side, a side surface positioned at the outer surface So side, a side surface positioned at the first side surface S1 side, and a side surface positioned at the second side surface S2 side, and a part of each of the terminal electrodes E11 to E14 is formed at upper portions of the above four side surfaces. The reason that the terminal electrodes E11 to E14 each have such a shape is due to a formation method for the terminal electrode to be described later.

Out of the four side surfaces constituting the convex portion corresponding to the terminal electrode E11, a side surface positioned at the first side surface S1 is assumed to be a third side surface S3. In this case, the first and third side surfaces S1 and S3 are parallel to each other, and a level difference therebetween is L1. On the other hand, out of the four side surfaces constituting the convex portion corresponding to the terminal electrode E12, a side surface positioned at the second side surface S2 is assumed to be a fourth side surface S4. In this case, the second and fourth side surfaces S2 and S4 form the same plane. That is, the second and fourth side surfaces S2 and S4 are parallel to each other, and a level difference L2 therebetween is zero (L1>L2).

The convex portions corresponding to the terminal electrodes E13 and E14 have shapes rotation symmetrical (two-fold rotation symmetrical) respectively to the convex portions corresponding to the terminal electrodes E11 and E12. Thus, assuming that, out of the four side surfaces constituting the convex portion corresponding to the terminal electrode E13, a side surface positioned at the first side surface S1 is assumed to be a third side surface S3, the first and third side surfaces S1 and S3 are parallel to each other, and a level difference therebetween is L1. On the other hand, assuming that, out of the four side surfaces constituting the convex portion corresponding to the terminal electrode E14, a side surface positioned at the second side surface S2 is assumed to be a fourth side surface S4, the second and fourth side surfaces S2 and S4 form the same plane. That is, the second and fourth side surfaces S2 and S4 are parallel to each other, and a level difference L2 therebetween is zero (L1>L2).

The drum-shaped core 20A need not be rotation symmetrical; however, when it is rotation symmetrical, the coil component 10A has no directivity, thus facilitating mounting work.

Surfaces of each of the flange portions 22A and 23A other than the top surface thereof do not have the concavo-convex shape. In particular, the bonding surface St has substantially a flat shape and thus comes into close contact with the flat plate-like core 30.

This is a structure of the coil component 10A according to the first embodiment of the present invention.

Figure 2:
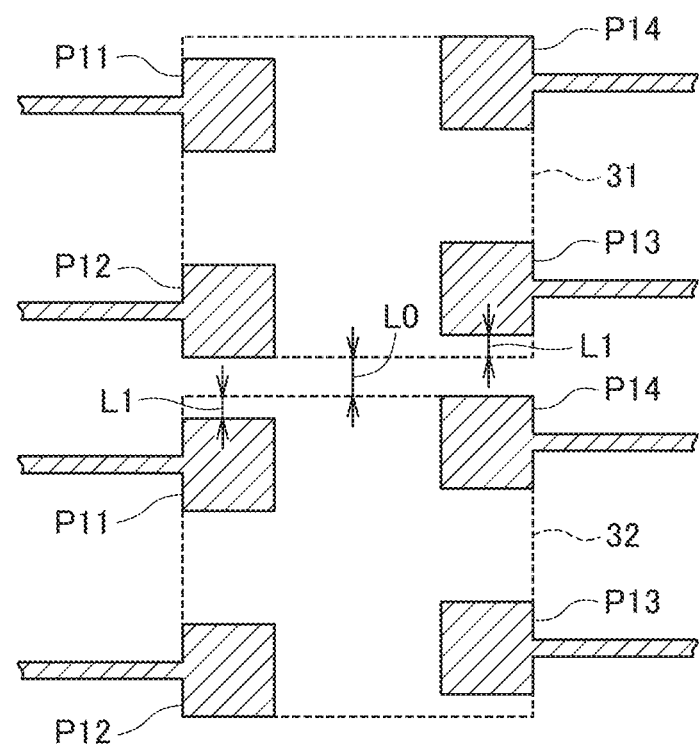
FIG. 2 is a plan view illustrating a conductor pattern on the circuit substrate on which the coil component shown in FIG. 1 is mounted.

FIG. 2 is a plan view illustrating a conductor pattern on the circuit substrate on which the coil component 10A is mounted.

In the example of FIG. 2, two mounting regions 31 and 32 are allocated on the substrate, and the coil components 10A are mounted respectively in the mounting regions 31 and 32. The mounting regions 31 and 32 are laid out in proximity with each other in an x-direction so as to realize high density mounting on the circuit substrate. Specifically, a gap between the mounting regions 31 and 32 is L0. A minimum value of the gap L0 is controlled depending on required reliability, specification, required mounting accuracy, and the like.

Figure 3:
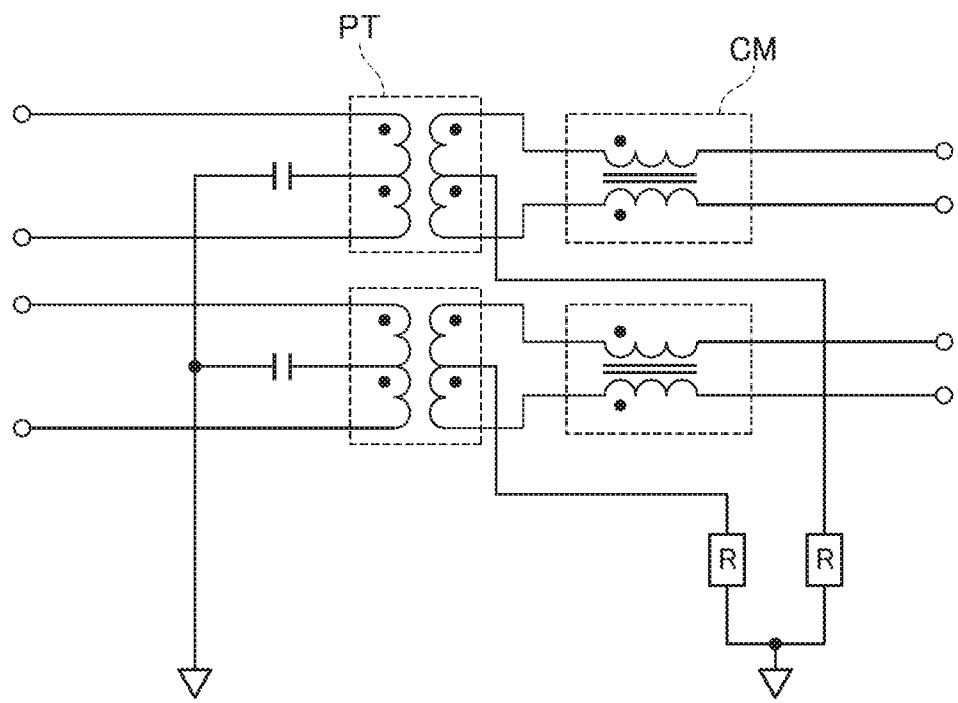
FIG. 3 is a circuit diagram of a LAN connector circuit (100 Base)
Figure 4:
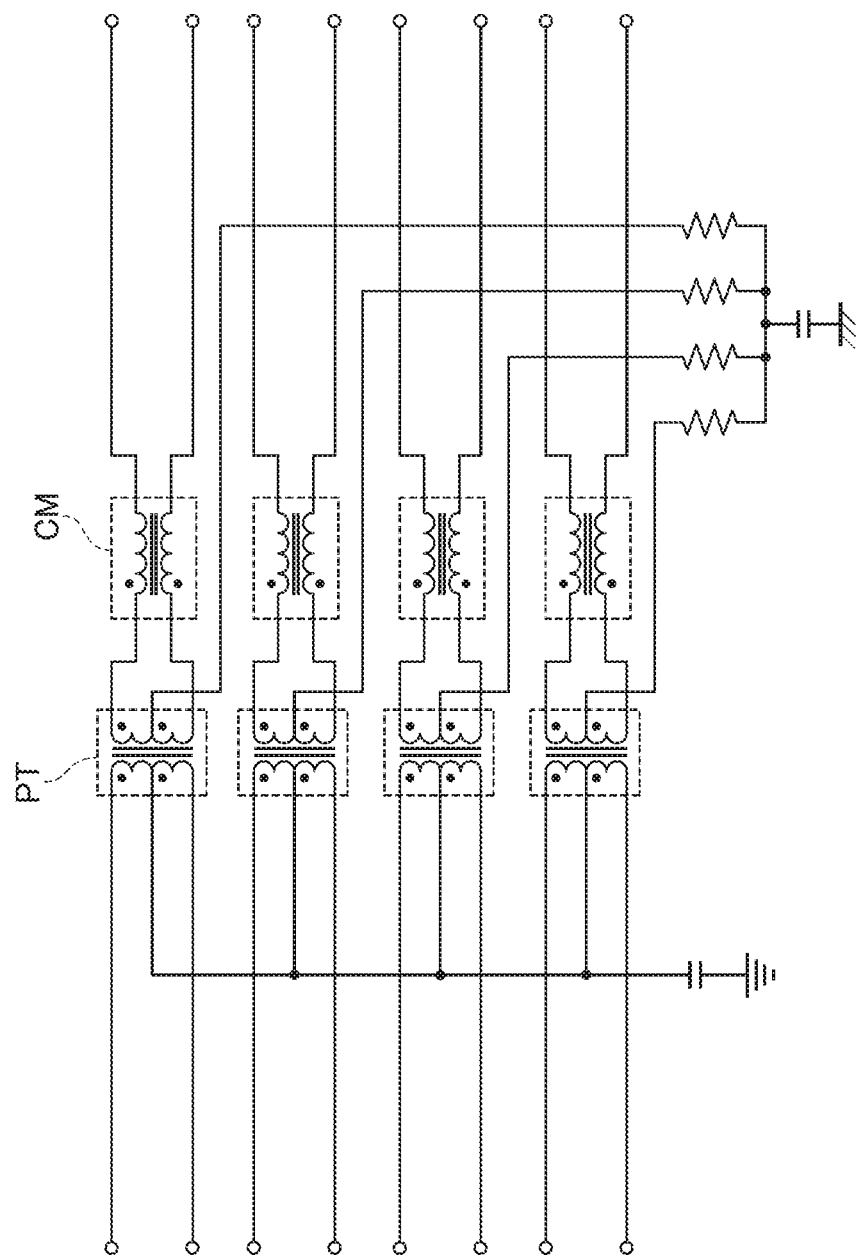
FIG. 4 is a circuit diagram of a LAN connector circuit (1000 Base)

In a case where the coil component 10A according to the present embodiment is a common mode choke coil, such a layout is required in, e.g., a LAN connector circuit (100 Base) illustrated in FIG. 3 and a LAN connector circuit (1000 Base) illustrated in FIG. 4. As illustrated in FIGS. 3 and 4, a plurality of common mode choke coils CM are used in the LAN connector, so that the mounting regions 31 and 32 may be in proximity when high density mounting is applied.

In each of the mounting regions 31 and 32, land patterns P11 to P14 connected respectively with the terminal electrodes E11 to E14 are provided. The terminal electrodes E11 to E14 and land patterns P11 to P14 are electrically and mechanically connected to each other, respectively, by soldering.

In the present embodiment, the convex portion corresponding to the terminal electrode E11 has the level difference L1, so that an x-direction gap between the land patterns P11 and P12 of the different coil components 10A is increased to a value obtained by L0+L1. Similarly, the convex portion corresponding to the terminal electrode E13 has the level difference L1, so that an x-direction gap between the land patterns P13 and P14 of the different coil components 10A is increased to a value obtained by L0+L1. That is, even when the gap L0 is very small, the land gap between the different coil components 10A can sufficiently be ensured.

To ensure the land gap is more important in a case where a size of each of the land patterns P11 to P14 is larger than a size of each of the terminal electrodes E11 to E14. This is because, as illustrated in FIG. 1, when a part of the terminal electrode is formed also on the side surfaces of the convex portion, a solder fillet may be formed when the size of each of the land patterns P11 to P14 is large, so that when the gap L0 is too small, a short circuit failure is likely to occur. However, the level difference L1 is added in the present embodiment, so that the short circuit failure can be prevented in such a case.

In order to prevent the above short circuit failure, it can be considered that the level difference L2 is set not to zero, but to a value equivalent to the level difference L1. That is, L2 may be set equal to L1. However, in this case, a size of the coil component 10A in the x-direction is increased. In view of this point, in the present embodiment, the level difference L1 is set large, while the level difference L2 is set small (zero), whereby both prevention of the short circuit failure and size reduction are realized.

In addition, in the coil component 10A according to the present embodiment, the level difference L2 is set to zero, so that the land patterns P12 and P14 can be disposed in edge portions of the respective mounting regions 31 and 32. This can enhance use efficiency of the circuit substrate. For example, even when a shortest distance between the edge of the circuit substrate and land pattern is limited, the coil component 10A can be mounted nearest the edge of the circuit substrate.

The following describes a method of forming the terminal electrodes E11 to E14 on the drum-shaped core 20A.

Figure 5:
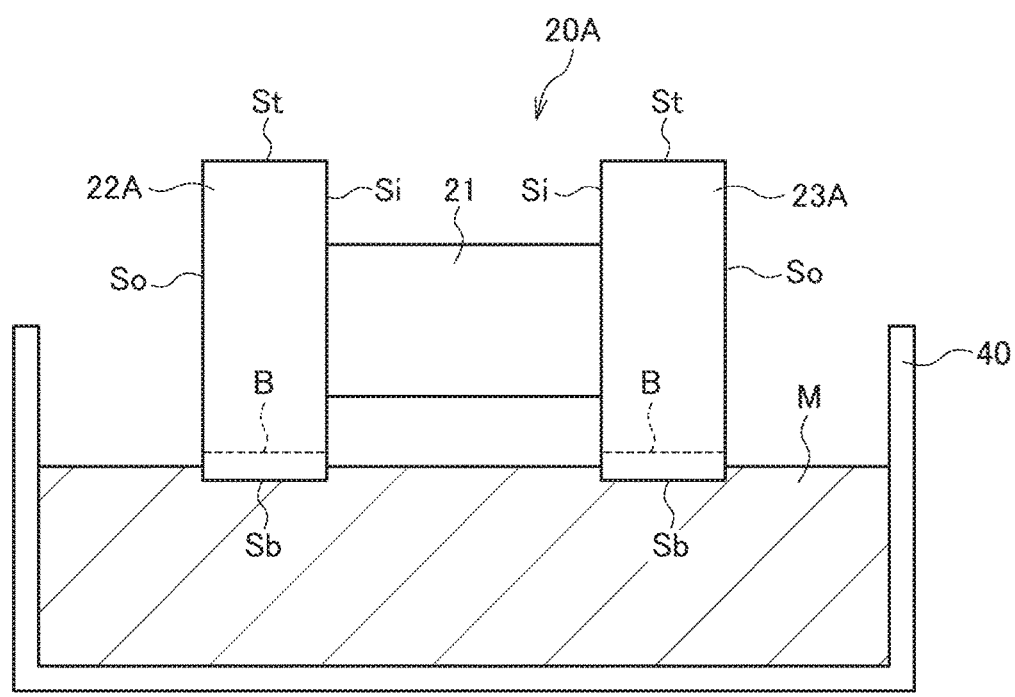
FIG. 5 is a schematic diagram for explaining a method for forming terminal electrodes.

First, the drum-shaped core 20A having the shape as illustrated in FIG. 1 is produced, and an electrode material in a liquid or paste form is prepared. As illustrated in FIG. 5, an electrode material M in a liquid or paste form is poured into a container 40 having an opened upper portion. Then, the convex portions protruding from the mounting surfaces Sb of the flange portions 22A and 23A are dipped in the electrode material M to thereby form the terminal electrodes on each mounting surface Sb. At this time, a dipping depth is controlled so as not to bring the concave portions of each mounting surface Sb into contact with the electrode material M. That is, the dipping depth is controlled such that a liquid surface of the electrode material M is positioned between the convex and concave portions. A reference symbol B illustrated in FIG. 5 denotes a bottom surface of the concave portion. With this procedure, the four terminal electrodes E11 to E14 can be formed at the same time on the mounting surfaces Sb of the flange portions 22A and 23A in a single dipping process. That is, the terminal electrodes E11 to E14 can be formed very easily by the dipping method without using a screen printing method or a mask sputtering method.

After formation of the terminal electrodes E11 to E14, the wires W11 and W12 are wound around the winding core 21. Then, the end portions of the wires W11 and W12 are connected to the corresponding terminal electrodes E11 to E14, whereby the coil component 10A according to the present embodiment is completed.

As described above, in the coil component 10A according to the present embodiment, the mounting surface Sb of the drum-shaped core 20A has the concavo-convex shape, so that the plurality of terminal electrodes E11 to E14 can be formed easily by using the dipping method. The terminal electrodes E11 to E14 are each formed on the top surface of the corresponding convex portion and at the upper portions of the four side surfaces constituting the convex portion.

Figure 6:
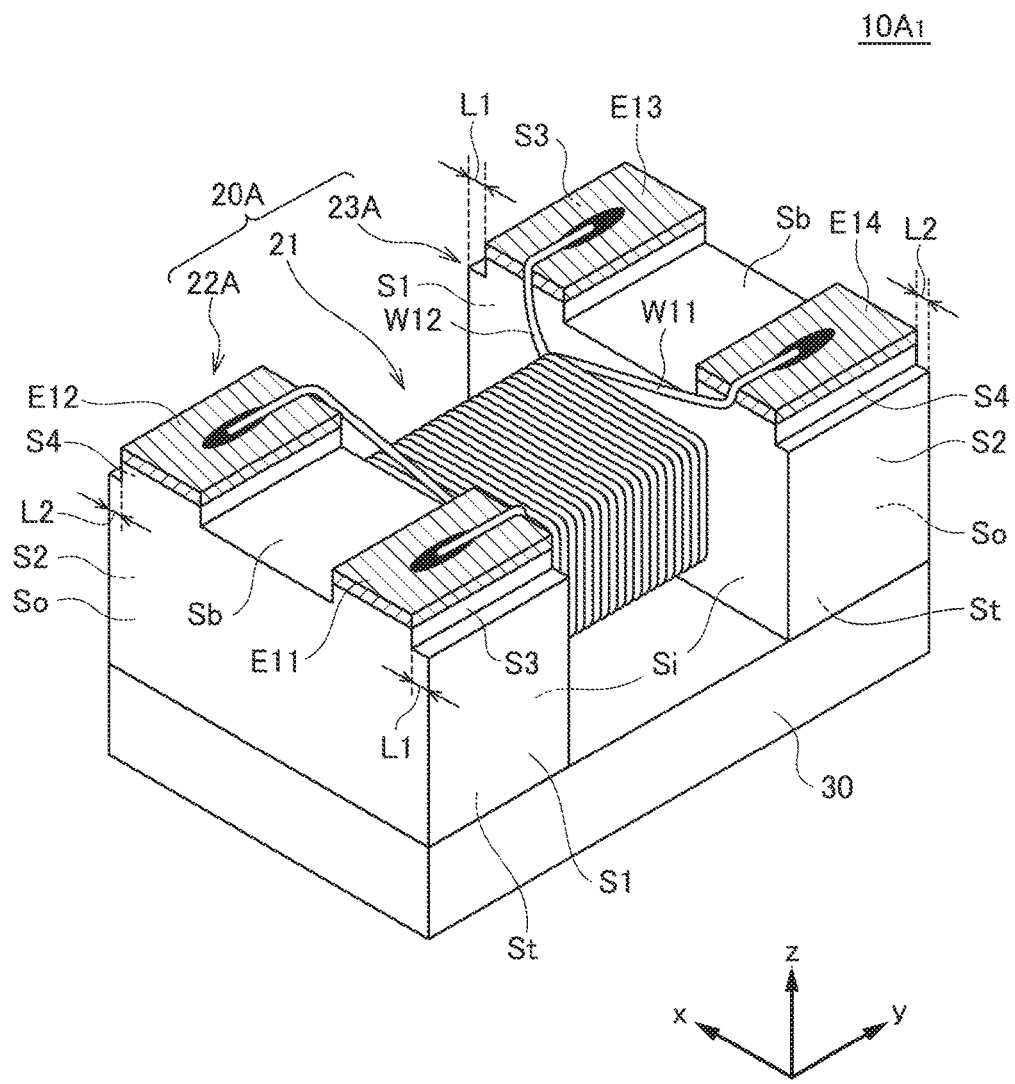
FIG. 6 is a schematic perspective view illustrating an external appearance of a coil component according to a modification of the first embodiment.

FIG. 6 is a schematic perspective view illustrating an external appearance of a coil component $10A_1$ according to a modification of the first embodiment.

The coil component $10A_1$ according to the modification differs from the above-described coil component 10A in that the level difference L2 is not zero. Accordingly, in this modification, the level difference L1 is reduced by that much. That is, a value obtained by L1+L2 in this modification is the same as that obtained in the first embodiment, and thus a relationship L1>L2 is satisfied. Other configurations are the same as those of the first embodiment, so the same reference numerals are used for the same elements, and repeated descriptions thereof are omitted here.

According to the present modification, when the coil components $10A_1$ are arranged juxtaposed in the mounting regions 31 and 32 on the circuit substrate, respectively, an x-direction gap between the land patterns P11 and P12 (P13 and P14) of the different coil components $10A_1$ is L0+L1+L2. This value is the same as that obtained by L0+L1 in the first embodiment, so that it is possible to obtain the same effect as that obtained by the coil component 10A according to the first embodiment.

As described above, although a difference between L1 and L2 is reduced in the present modification, the relationship L1>L2 is maintained. If L1 is equal to L2, the land patterns P11 to P14 are largely separated from the edges of the mounting regions 31 and 32, with the result that the use efficiency of the circuit substrate is deteriorated.

Figure 7:
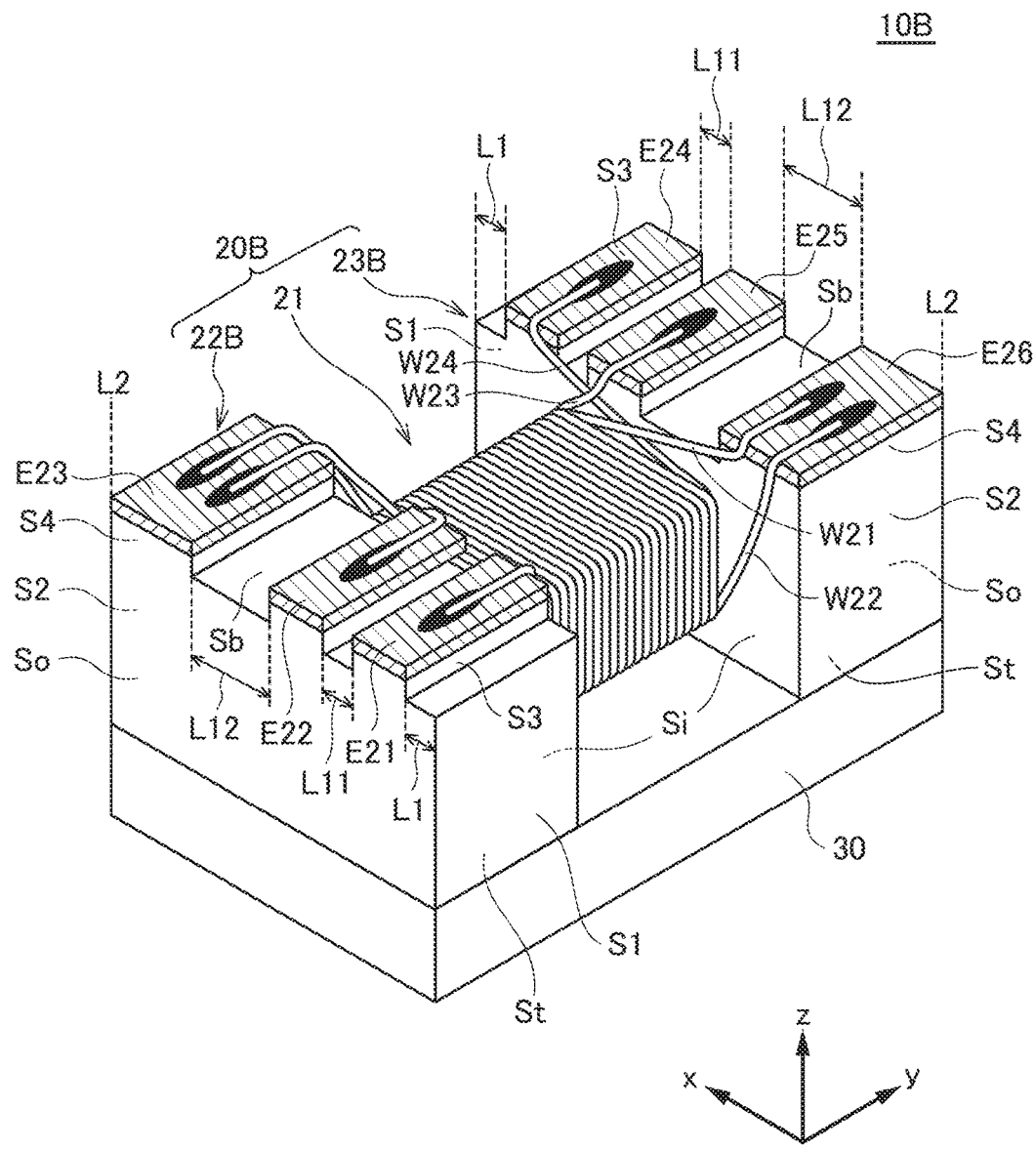
FIG. 7 is a schematic perspective view illustrating an external appearance of a coil component according to a second embodiment of the present invention.

FIG. 7 is a schematic perspective view illustrating an external appearance of a coil component 10B according to a second embodiment of the present invention.

A drum-shaped core 20B is used in the coil component 10B according to the present embodiment. The drum-shaped core 20B has a pair of flange portions 22B and 23B provided at y-direction both ends of the winding core 21. The flange portions 22B and 23B each have three convex portions. As in the first embodiment, terminal electrodes are formed respectively on top surfaces of the convex portions. Specifically, the flange portion 22B has three terminal electrodes E21 to E23, and the flange portion 23B has three terminal electrodes E24 to E26. The plurality of terminal electrodes (e.g., E21 to E23) formed in the same flange are electrically isolated from each other by the concave portion.

Four wires W21 to W24 are wound around the winding core 21. The wire W21 is connected to the terminal electrodes E21 and E26, and a winding direction thereof is, e.g., a clockwise direction. The wire W22 is connected to the terminal electrodes E22 and E26, and a winding direction thereof is, e.g., a counterclockwise direction. The wire W23 is connected to the terminal electrodes E23 and E25, and a winding direction thereof is, e.g., a clockwise direction. The wire W24 is connected to the terminal electrodes E23 and E24, and a winding direction thereof is, e.g., a counterclockwise direction.

With the above configuration, there is constructed a pulse transformer in which the terminal electrodes E21 and E22 are complementary primary-side terminals, the terminal electrodes E24 and E25 are complementary secondary-side terminals, the terminal electrode E26 is a primary-side center tap, and the terminal electrode E23 is a secondary-side center tap.

In the present embodiment, an x-direction gap L12 between the terminal electrodes E22 and E23 is larger than an x-direction gap L11 between the terminal electrodes E21 and E22 (L11>L12). Similarly, an x-direction gap L12 between the terminal electrodes E25 and E26 is larger than an x-direction gap L11 between the terminal electrodes E24 and E25 (L11>L12). As a result, a breakdown voltage between the primary and secondary sides is increased.

Out of the three convex portions formed on the flange portion 22B, the convex portion closest to a first side surface S1 has a third side surface S3 parallel to the first side surface S1 and positioned at the first side surface S1 side, and a level difference between the first and third side surfaces S1 and S3 is L1. On the other hand, out of the three convex portions formed on the flange portion 22B, the convex portion closest to a second side surface S2 has a fourth side surface S4 forming the same plane with the second side surface S2, and a level difference L2 between the second and fourth side surfaces S2 and S4 is zero (L1>L2).

The drum-shaped core 20B has a two-fold rotation-symmetrical shape. Thus, the flange portion 23B has the same configuration as that of the above-described flange portion 22B.

Figure 8:
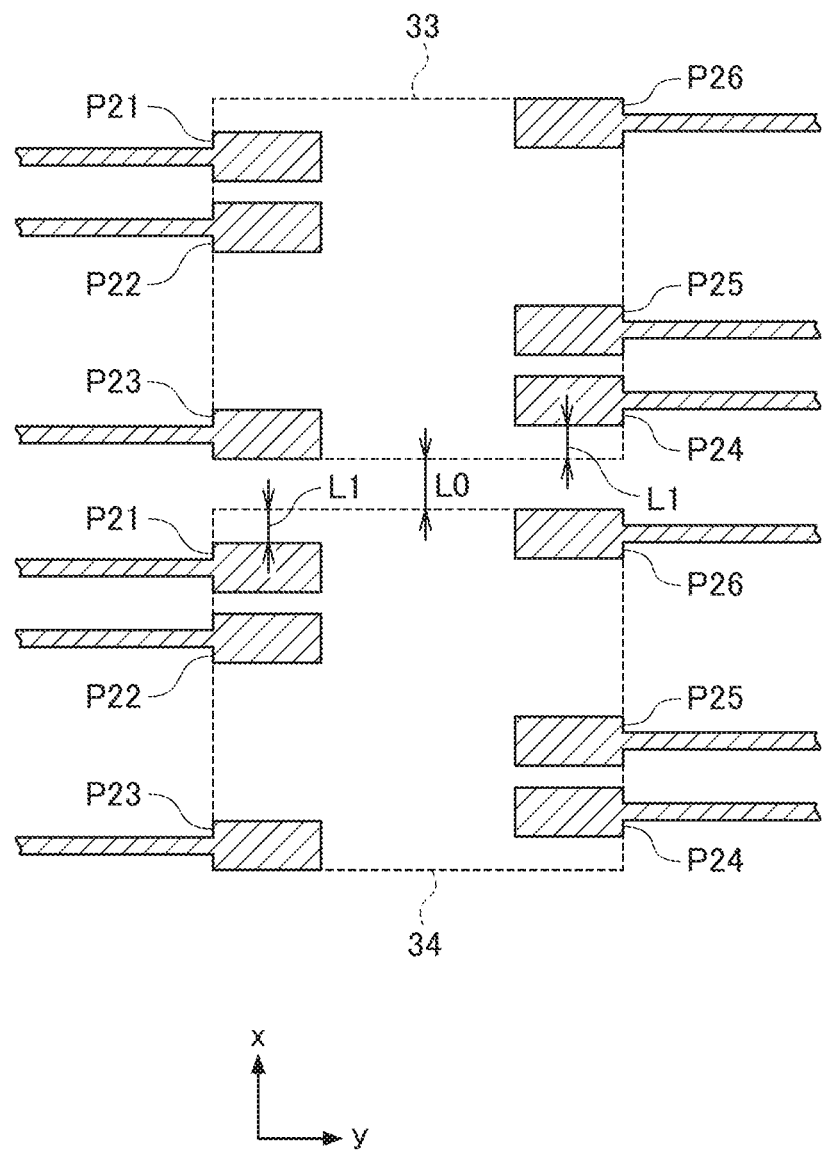
FIG. 8 is a plan view illustrating a conductor pattern on the circuit substrate on which the coil component shown in FIG. 7 is mounted.

The coil component 10B according to the present embodiment can be used as a pulse transformer PT for the LAN connector circuit (100 BASE) illustrated in FIG. 3 and the LAN connector circuit (1000 BASE) illustrated in FIG. 4. Also in this embodiment, as illustrated in FIG. 8, mounting regions 33 and 34 are in proximity when high density mounting is applied. Land patterns P21 to P26 illustrated in FIG. 8 are patterns to be connected to the terminal electrodes E21 to E26, respectively.

Also in the present embodiment, as in the first embodiment, the level difference L1 is formed in each of the flange portions 22B and 23B, so that an x-direction gap between the land patterns P21 and P23 (P24 and P26) of the different coil components 10B is increased to a value obtained by L0+L1. Thus, even when the gap L0 is very small, the land gap between the different coil components 10B can sufficiently be ensured, thereby making it possible to prevent a short circuit failure.

Figure 9:
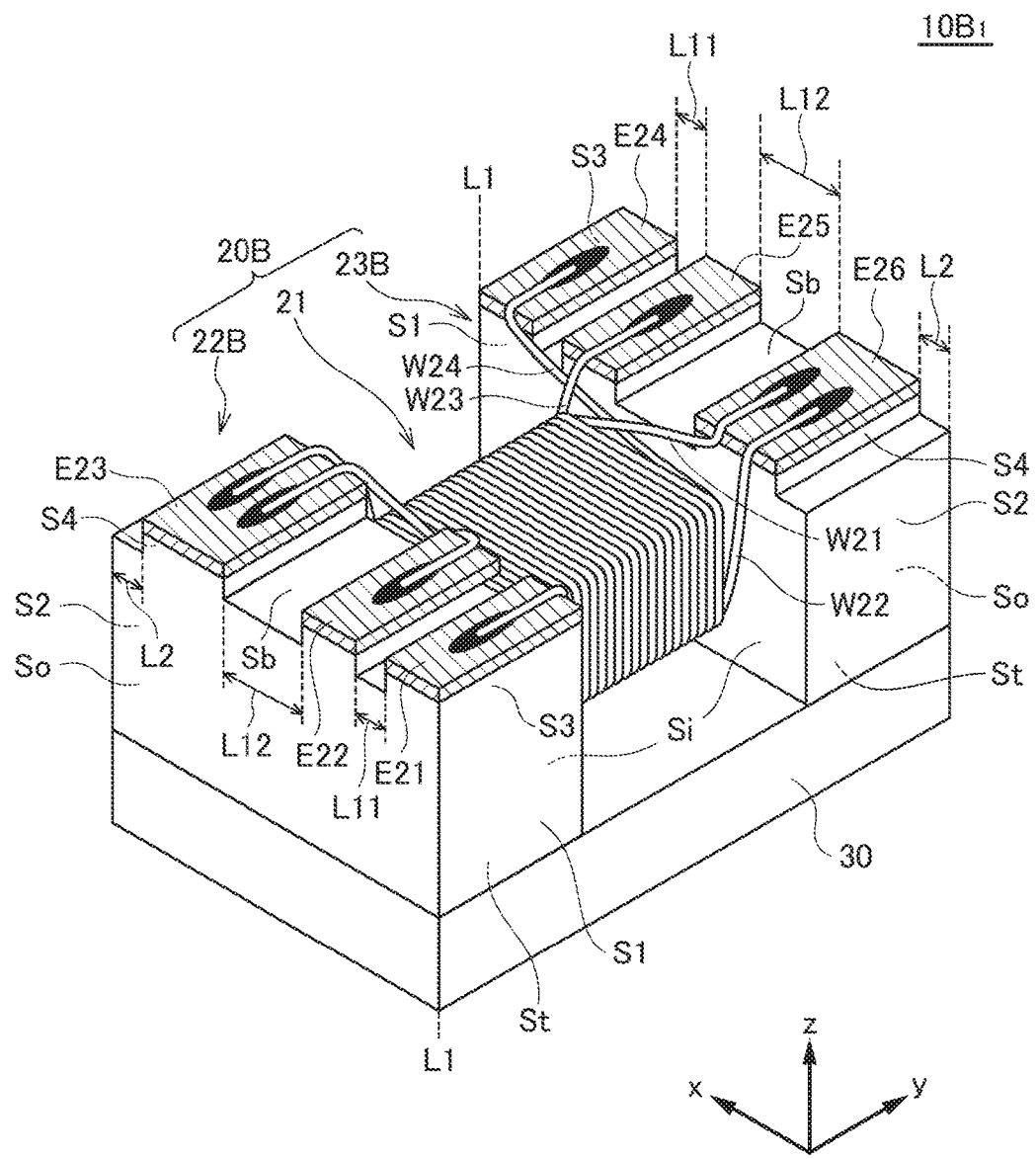
FIG. 9 is a schematic perspective view illustrating an external appearance of a coil component according to a first modification of the second embodiment.

FIG. 9 is a schematic perspective view illustrating an external appearance of a coil component $10B_1$ according to a first modification of the second embodiment.

The coil component $10B_1$ according to the first modification differs from the above-described coil component 10B in that the level difference L1 is zero and that the level difference L2 has a predetermined length. That is, values of the level differences L1 and L2 are replaced with each other. Other configurations are the same as those of the coil component 10B, so the same reference numerals are used for the same elements, and repeated descriptions thereof are omitted here. Even with such a configuration, when the coil components $10B_1$ are mounted in proximity on the circuit substrate, an x-direction gap between the land patterns P21 and P23 (P24 and P26) of the different coil component $10B_1$ is increased to a value obtained by L0+L2, thereby making it possible to prevent a short circuit failure.

Figure 10:
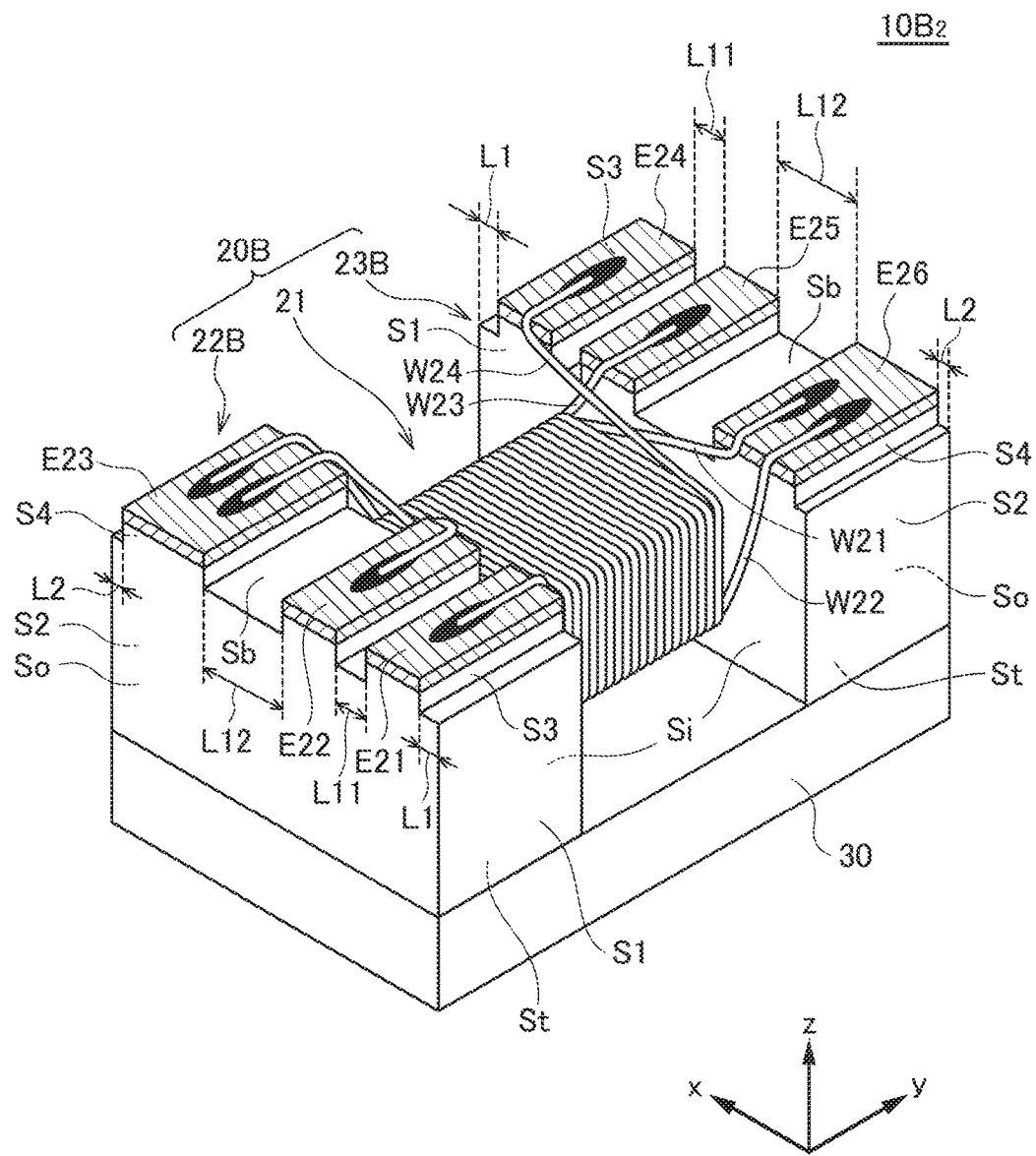
FIG. 10 is a schematic perspective view illustrating an external appearance of a coil component according to a second modification of the second embodiment.

FIG. 10 is a schematic perspective view illustrating an external appearance of a coil component $10B_2$ according to a second modification of the second embodiment.

The coil component $10B_2$ according to the second modification differs from the above-described coil component 10B in that the level difference L2 is not zero. Accordingly, in this modification, the level difference L1 is reduced by that much. That is, a value obtained by L1+L2 is the same as that obtained in the coil component 10B, and thus a relationship L1>L2 is satisfied. Other configurations are the same as those of the coil component 10B, so the same reference numerals are used for the same elements, and repeated descriptions thereof are omitted here. Even with such a configuration, when the coil components $10B_2$ are mounted in proximity on the circuit substrate, an x-direction gap between the land patterns P21 and P23 (P24 and P26) of the different coil component $10B_2$ is increased to a value obtained by L0+L1+L2, thereby making it possible to prevent a short circuit failure.

Figure 11:
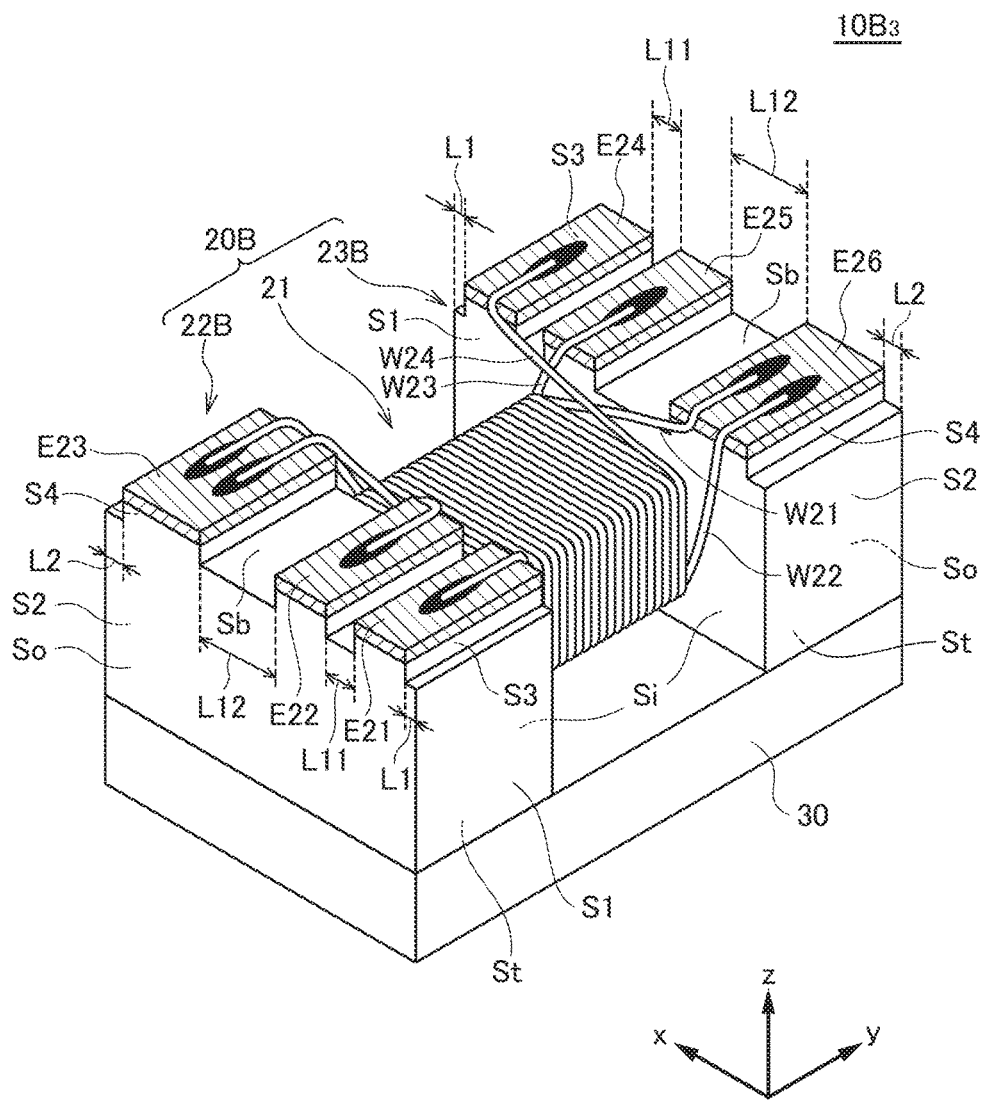
FIG. 11 is a schematic perspective view illustrating an external appearance of a coil component according to a third modification of the second embodiment.

FIG. 11 is a schematic perspective view illustrating an external appearance of a coil component $10B_3$ according to a third modification of the second embodiment.

The coil component $10B_3$ according to the third modification differs from the above-described coil component $10B_1$ in that the level difference L1 is not zero. Accordingly, in this modification, the level difference L2 is reduced by that much. That is, a value obtained by L1+L2 is the same as that obtained in the coil component $10B_1$, and thus a relationship L1<L2 is satisfied. Other configurations are the same as those of the coil component $10B_1$, so the same reference numerals are used for the same elements, and repeated descriptions thereof are omitted here. Even with such a configuration, when the coil components $10B_3$ are mounted in proximity on the circuit substrate, an x-direction gap between the land patterns P21 and P23 (P24 and P26) of the different coil component $10B_3$ is increased to a value obtained by L0+L1+L2, thereby making it possible to prevent a short circuit failure.

Figure 12:
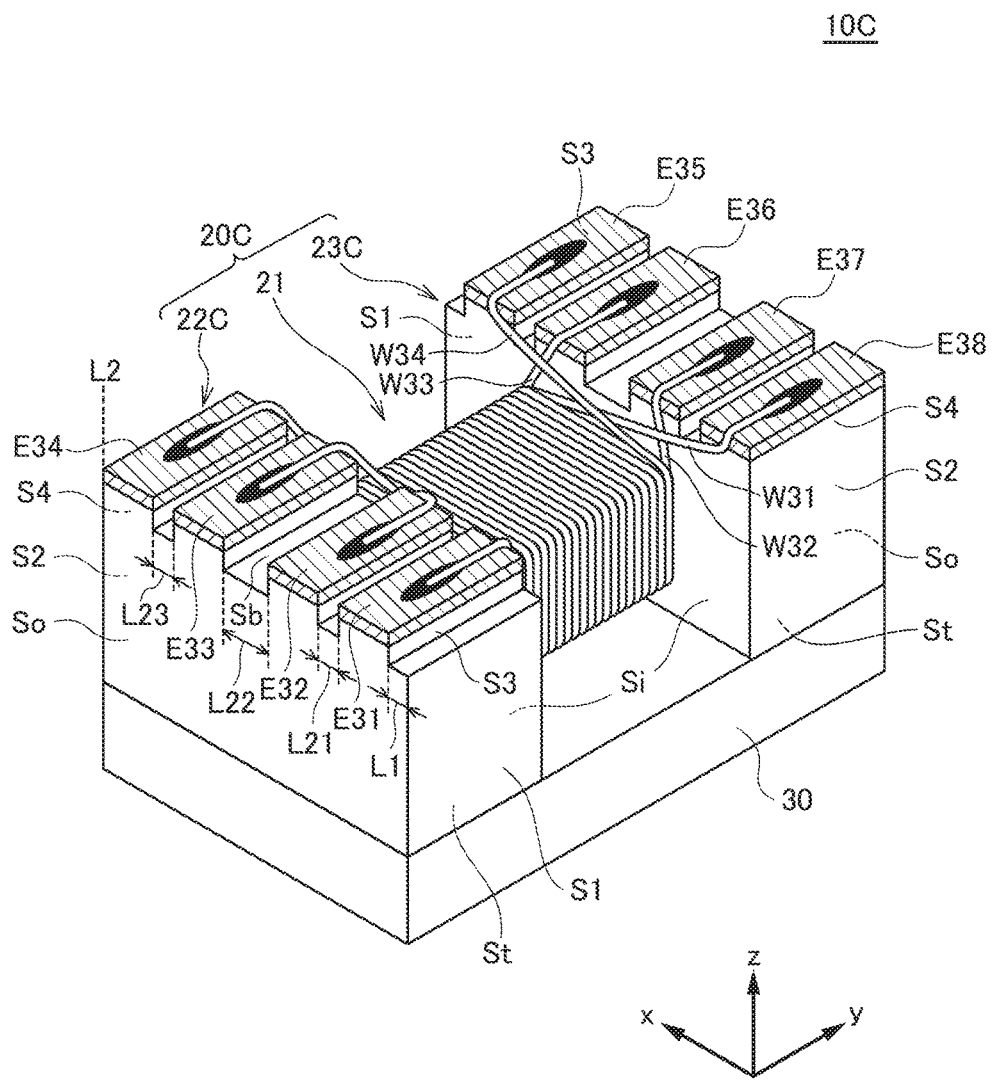
FIG. 12 is a schematic perspective view illustrating an external appearance of a coil component according to a third embodiment of the present invention.

FIG. 12 is a schematic perspective view illustrating an external appearance of a coil component 10C according to a third embodiment of the present invention.

A drum-shaped core 20C is used in the coil component 10C according to the present embodiment. The drum-shaped core 20C has a pair of flange portions 22C and 23C provided at y-direction both ends of the winding core 21. The flange portions 22C and 23C each have four convex portions. As in the first embodiment, terminal electrodes are formed respectively on top surfaces of the convex portions. Specifically, the flange portion 22C has four terminal electrodes E31 to E34, and the flange portion 23C has four terminal electrodes E35 to E38. The plurality of terminal electrodes (e.g., E31 to E34) formed in the same flange are electrically isolated from each other by the concave portion.

Four wires W31 to W34 are wound around the winding core 21. The wire W31 is connected to the terminal electrodes E31 and E38, and a winding direction thereof is, e.g., a clockwise direction. The wire W32 is connected to the terminal electrodes E32 and E37, and a winding direction thereof is, e.g., a counterclockwise direction. The wire W33 is connected to the terminal electrodes E33 and E36, and a winding direction thereof is, e.g., a clockwise direction. The wire W34 is connected to the terminal electrodes E34 and E35, and a winding direction thereof is, e.g., a counterclockwise direction.

With the above configuration, there is constructed a pulse transformer in which the terminal electrodes E31 and E32 are complementary primary-side terminals, the terminal electrodes E35 and E36 are complementary secondary-side terminals, the terminal electrodes E37 and E38 constitute a primary-side center tap, and the terminal electrodes E33 and E34 constitute a secondary-side center tap. The above pulse transformer can be used as a pulse transformer PT for the LAN connector circuit (100 BASE) illustrated in FIG. 3 and the LAN connector circuit (1000 BASE) illustrated in FIG. 4.

In the present embodiment, an x-direction gap L22 between the terminal electrodes E32 and E33 is larger than an x-direction gap L21 between the terminal electrodes E31 and E32 and an x-direction gap L23 between the terminal electrodes E33 and E34 (L21=L23<L22). Similarly, an x-direction gap L22 between the terminal electrodes E36 and E37 is larger than an x-direction gap L21 between the terminal electrodes E35 and E36 and an x-direction gap L23 between the terminal electrodes E37 and E38 (L21=L23<L22). As a result, a breakdown voltage between the primary and secondary sides is increased.

Out of the four convex portions formed on the flange portion 22C, the convex portion closest to a first side surface S1 has a third side surface S3 parallel to the first side surface S1 and positioned at the first side surface S1 side, and a level difference between the first and third side surfaces S1 and S3 is L1. On the other hand, out of the four convex portions formed on the flange portion 22C, the convex portion closest to a second side surface S2 has a fourth side surface S4 forming the same plane with the second side surface S2, and a level difference L2 between the second and fourth side surfaces S2 and S4 is zero (L1>L2).

The drum-shaped core 20C has a two-fold rotation-symmetrical shape. Thus, the flange portion 23C has the same configuration as that of the above-described flange portion 22C.

Figure 13:
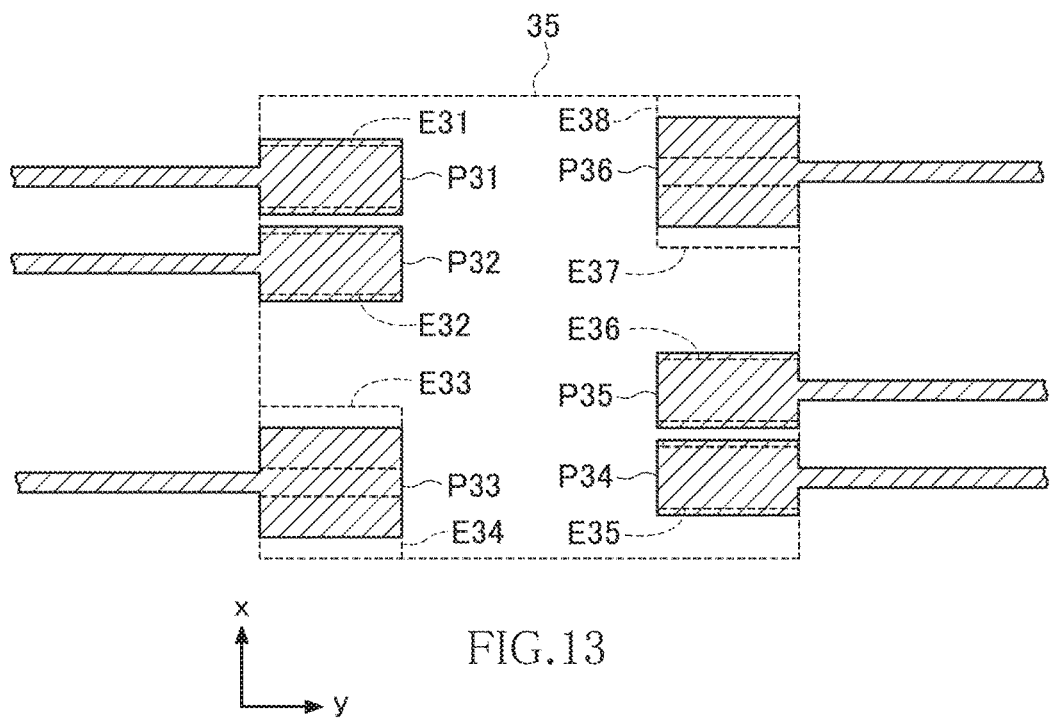
FIG. 13 is a plan view illustrating an example of a conductor pattern on the circuit substrate on which the coil component shown in FIG. 12 is mounted.

The coil component 10C according to the present embodiment short-circuits the terminal electrodes E37 and E38 constituting the primary-side center tap and short-circuits the terminal electrodes E33 and E34 constituting the secondary-side center tap, thereby making it possible for the coil component 10C to perform exactly the same function as that of the coil component 10B according to the second embodiment. The short circuit of the center tap can be made on the circuit substrate. That is, the circuit substrate having a land pattern illustrated in FIG. 13 is used, and the coil component 10C is mounted in a mounting region 35 on the circuit substrate, whereby the terminal electrodes E33 and E34 can be short-circuited by a common land pattern P33, and the terminal electrodes E37 and E38 can be short-circuited by a common land pattern P36.

The land patterns P33 and P36 each have an x-direction width larger than those of the other land patterns P31, P32, P34, and P35. This facilitates connection between the land pattern P33 and two terminal electrodes E33 and E34 to be short-circuited and connection between the land pattern P36 and two terminal electrodes E37 and E38 to be short-circuited. In FIG. 13, dashed lines E33, E34, E37, and E38 indicate mounting positions of the respective terminal electrodes E33, E34, E37, and E38, and it can be seen that apart of the terminal electrode and a part of the corresponding land pattern are overlapped with each other in a plan view.

Figure 14:
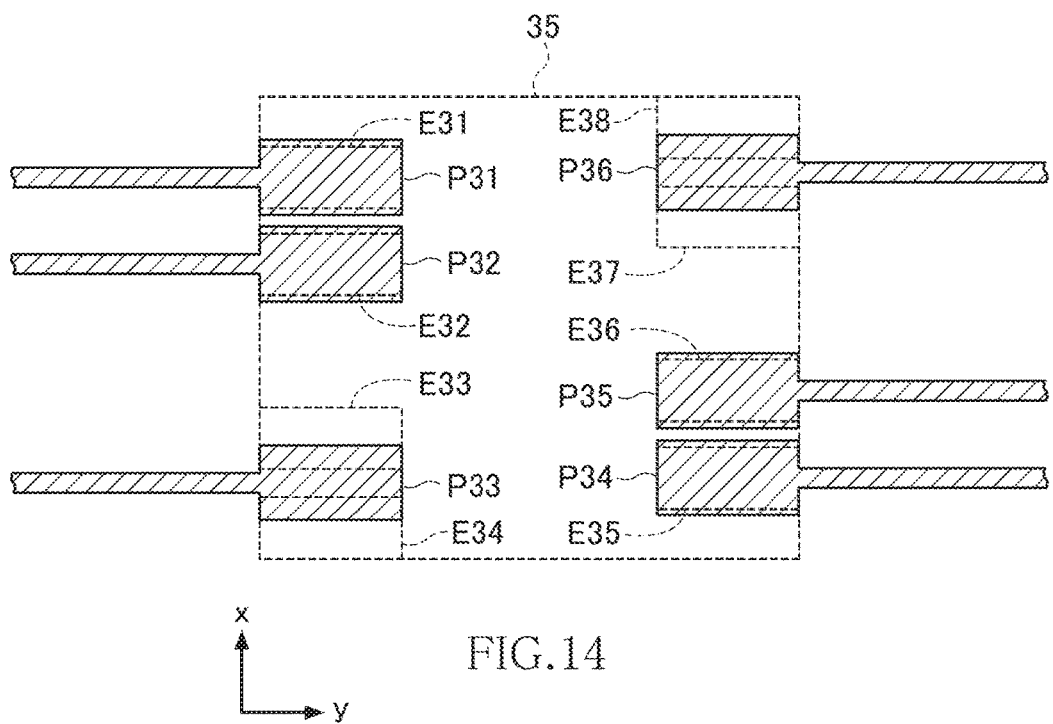
FIG. 14 is a plan view illustrating another example of a conductor pattern on the circuit substrate on which the coil component shown in FIG. 12 is mounted.

However, enlarging of the x-direction widths of the land patterns P33 and P36 is not essential, but the land patterns P33 and P36 may each have the same x-direction width as those of the other land patterns P31, P32, P34, and P35, as illustrated in FIG. 14. Even in this case, the land pattern P33 needs to be overlapped with a part of each of the terminal electrodes E33 and E34 and to cover the entire area of a gap between the terminal electrodes E33 and E34. Similarly, the land pattern P36 needs to be overlapped with a part of each of the terminal electrodes E37 and E38 and to cover the entire area of a gap between the terminal electrodes E37 and E38.

In the above example, the terminal electrodes E33 and E34 are short-circuited to be used as the secondary-side center tap, and the terminal electrodes E37 and E38 are short-circuited to be used as the primary-side center tap; however, a configuration may be adopted in which the terminal electrodes E31 and E32 are short-circuited to be used as the secondary-side center tap, and the terminal electrodes E35 and E36 are short-circuited to be used as the primary-side center tap. In this case, the terminal electrodes E33 and E34 are complementary primary-side terminals, and the terminal electrodes E37 and E38 are complementary secondary-side terminals.

Figure 15:
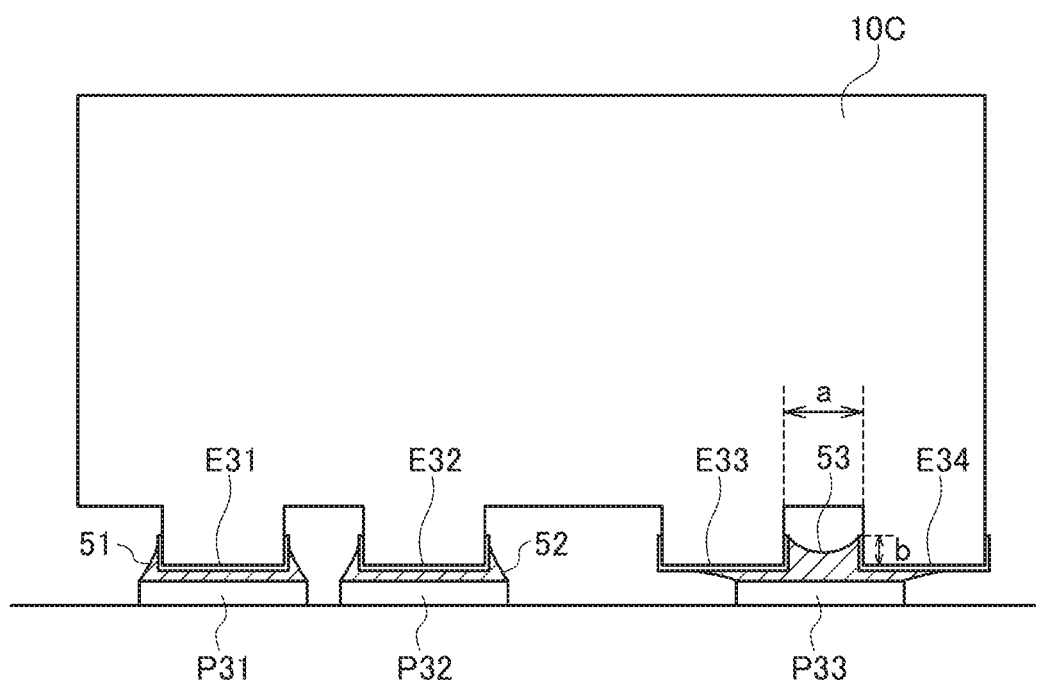
FIG. 15 is a side view of the coil component shown in FIG. 12 mounted on the circuit substrate.

FIG. 15 is a side view of the coil component 10C mounted on the circuit substrate.

In the example of FIG. 15, the terminal electrode E31 and the land pattern P31 are connected by a solder 51, the terminal electrode E32 and the land pattern P32 are connected by a solder 52, and the terminal electrodes E33, E34 and the land pattern P33 are connected by a solder 53. The land patterns P31 and P32 have an x-direction size larger than those of the corresponding terminal electrodes E31 and E32, and a part of each of the terminal electrodes E31 and E32 is formed also on side surfaces of each of corresponding convex portion, so that the solders 51 and 52 each form a fillet extending in the x-direction. Forming the solder fillet increases bonding strength, thereby increasing reliability of a product after mounting.

On the other hand, the land pattern P33 is disposed so as to cover the entire area of a gap between the terminal electrodes E33 and E34, and a part of each of the terminal electrodes E33 and E34 is formed also on side surfaces of each of corresponding convex portion, so that the fillet of the solder 53 forms a bridge directly connecting the terminal electrodes E33 and E34. As a result, the terminal electrodes E33 and E34 are short-circuited not only via the land pattern P33 but also via the bridge of the solder 53. This realizes the short circuit more reliably.

Assuming that a gap (strictly speaking, a gap measured at an intermediate position in a height direction of the convex portion) between the convex portion corresponding to the terminal electrode E33 and the convex portion corresponding to the terminal electrode E34 is a, and a height of each of the terminal electrodes E33 and E34 formed on the side surfaces of each convex portion is b, $b/a \geq 1/3$ is preferably satisfied, and $b/a \geq 1/2$ is more preferably satisfied.

Satisfying this condition facilitates formation of the bridge of the solder 53.

Figure 16:
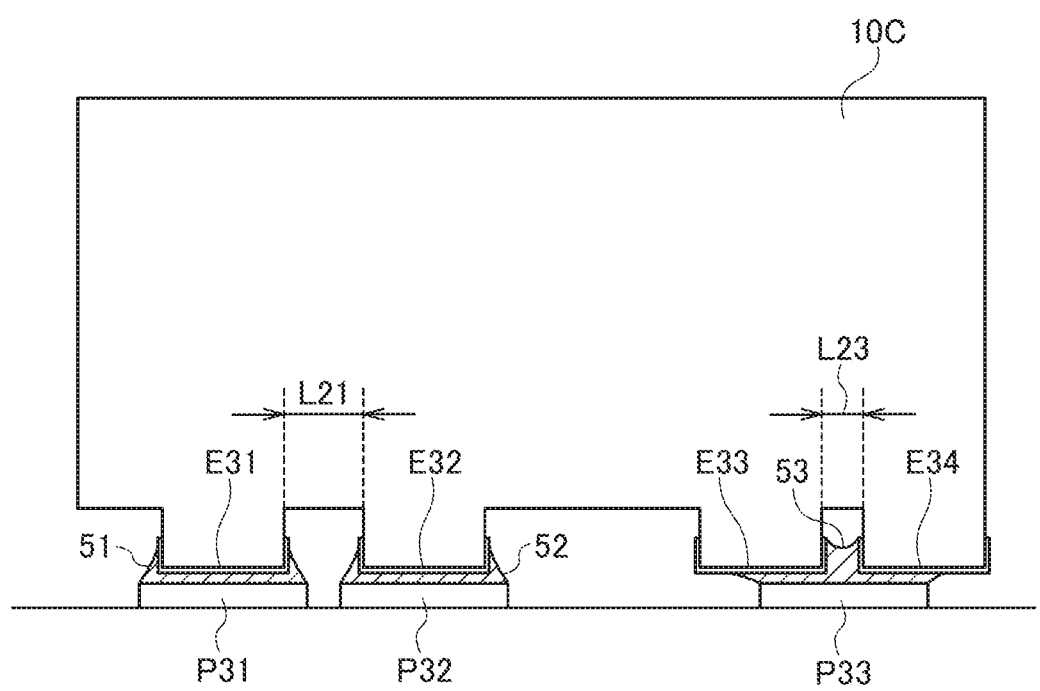
FIG. 16 is a side view of a modified coil component of the coil component shown in FIG. 12 mounted on the circuit substrate.

In order to form the bridge of the solder 53 more reliably, an x-direction gap between the terminal electrodes E33 and E34 may be reduced, as illustrated in FIG. 16. Specifically, assuming that an x-direction gap between the terminal electrodes E31 and E32 is L21 and that an x-direction gap between the terminal electrodes E33 and E34 is L23, a relationship L21>L23 may be satisfied. Satisfying this relationship allows a distance between the opposing side surfaces of the convex portion corresponding to the terminal electrode E33 and the convex portion corresponding to the terminal electrode E34 to be reduced, so that it is possible to form the bridge reliably with a smaller amount of solder.

Figure 17:
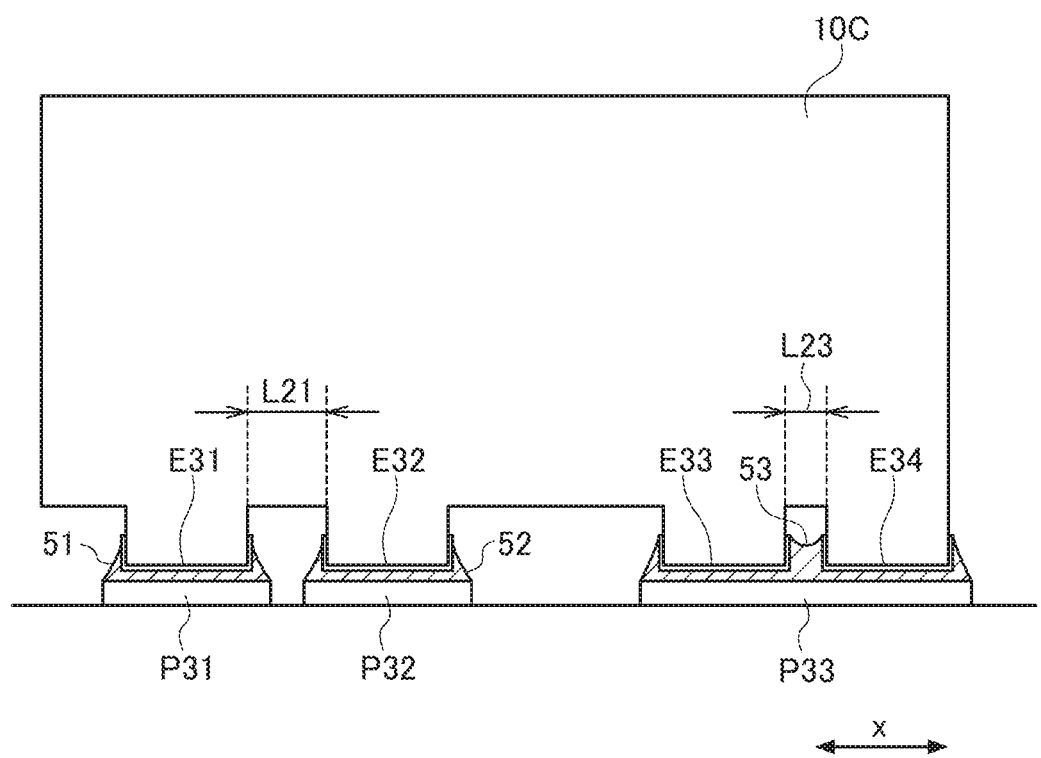
FIG. 17 is a side view of the modified coil component mounted on the circuit substrate in which a width of a land pattern is enlarged.

As illustrated in FIG. 17, the common land pattern P33 may have an x-direction width that covers completely the terminal electrodes E33 and E34. In this case, a fillet that extends outside is formed also in the solder 53, so that it is possible to increase reliability of a product after mounting.

It is apparent that the present invention is not limited to the above embodiments, but may be modified and changed without departing from the scope and spirit of the invention.

What is claimed is:

1. A coil component comprising:
 a drum-shaped core having a pair of flange portions and a winding core positioned between the pair of flange portions;

a plurality of terminal electrodes formed on each of the flange portions; and
a plurality of wires wound around the winding core and connected to the terminal electrodes, wherein
each of the flange portions includes:
 a mounting surface substantially parallel to an axial direction of the winding core; and
 first and second side surfaces substantially parallel to the axial direction of the winding core and substantially parallel to each other,
the mounting surface has a plurality of convex portions and at least one concave portion positioned between the plurality of convex portions,
each of the terminal electrodes is formed at least on an associated one of the convex portions such that the terminal electrodes are isolated by the concave portion,
the plurality of convex portions includes a first convex portion closest to the first side surface, the first convex portion having a third side surface that is substantially parallel to the first side surface,
the plurality of convex portions includes a second convex portion closest to the second side surface, the second convex portion having a fourth side surface that is substantially parallel to the second side surface, and
a level difference between the first side surface and the third side surface is larger than a level difference between the second side surface and the fourth side surface.

2. The coil component as claimed in claim 1, wherein the terminal electrodes are further formed on the third and fourth side surfaces.

3. The coil component as claimed in claim 1, wherein the second side surface and the fourth side surface form substantially the same plane.

4. The coil component as claimed in claim 1, wherein
the plurality of convex portions further includes third and fourth convex portions,
the first, third, fourth, and second convex portions are arranged in this order, and
the plurality of terminal electrodes include first, second, third, and fourth electrodes formed respectively on the first, second, third, and fourth convex portions.

5. The coil component as claimed in claim 4, wherein a gap between the third and fourth convex portions is larger than a gap between the first and third convex portions and a gap between the second and four convex portions.

6. The coil component as claimed in claim 5, wherein the gap between the first and third convex portions and the gap between the second and fourth convex portions differ from each other.

7. The coil component as claimed in claim 4, wherein
the first, second, third, and fourth terminal electrodes are formed on side surfaces of the first, second, third, and fourth convex portions, respectively,
when the gap between the first and third convex portions or the gap between the second and fourth convex portions is a, and a height of each of the first, second, third, and fourth terminal electrodes formed on the side surfaces of the first, second, third, and fourth convex portions, respectively, is b,
b/a≥⅓ is satisfied.

8. The coil component as claimed in claim 1, wherein the drum-shaped core has a two-fold rotation-symmetrical shape.

9. A circuit substrate comprising:
a substrate having a plurality of land patterns; and
a coil component mounted on the substrate, wherein
the coil component includes:
 a drum-shaped core having a pair of flange portions and a winding core positioned between the pair of flange portions;
 a plurality of terminal electrodes formed on each of the flange portions; and
 a plurality of wires wound around the winding core and connected to the terminal electrodes,
each of the flange portions includes:
 a mounting surface substantially parallel to an axial direction of the winding core; and
 first and second side surfaces substantially parallel to the axial direction of the winding core and substantially parallel to each other,
the mounting surface has a plurality of convex portions and at least one concave portion positioned between the plurality of convex portions,
each of the terminal electrodes is formed at least on an associated one of the convex portions such that the terminal electrodes are isolated by the concave portion,
the plurality of convex portions includes a first convex portion closest to the first side surface, the first convex portion having a third side surface that is substantially parallel to the first side surface,
the plurality of convex portions includes a second convex portion closest to the second side surface, the second convex portion having a fourth side surface that is substantially parallel to the second side surface,
a level difference between the first side surface and the third side surface is larger than a level difference between the second side surface and the fourth side surface, and
the circuit substrate further comprises a solder connecting the plurality of land patterns to the plurality of terminal electrodes.

10. The circuit substrate as claimed in claim 9, wherein at least two coil components are mounted on the substrate such that the first side surface of one coil component and the second side surface of the other coil component face each other.

11. A circuit substrate comprising:
a substrate having a plurality of land patterns; and
a coil component mounted on the substrate, wherein
the coil component includes:
 a drum-shaped core having a pair of flange portions and a winding core positioned between the pair of flange portions;
 a plurality of terminal electrodes formed on each of the flange portions; and
 a plurality of wires wound around the winding core and connected to the terminal electrodes,
each of the flange portions includes:
 a mounting surface substantially parallel to an axial direction of the winding core; and
 first and second side surfaces substantially parallel to the axial direction of the winding core and substantially parallel to each other,
the mounting surface has a plurality of convex portions and at least one concave portion positioned between the plurality of convex portions,
each of the terminal electrodes is formed at least on an associated one of the convex portions such that the terminal electrodes are isolated by the concave portion,
the plurality of convex portions includes a first convex portion closest to the first side surface, the first convex portion having a third side surface that is substantially parallel to the first side surface, the plurality of convex portions includes a second convex portion closest to the second side surface, the second convex portion having a fourth side surface that is substantially parallel to the second side surface, a level difference between the first side surface and the third side surface is larger than a level difference between the second side surface and the fourth side surface, the plurality of convex portions further includes third and fourth convex portions, the first, third, fourth, and second convex portions are arranged in this order, the plurality of terminal electrodes include first, second, third, and fourth electrodes formed respectively on the first, second, third, and fourth convex portions, the circuit substrate further comprises a solder connecting the plurality of land patterns to the plurality of terminal electrodes, and the plurality of land patterns includes a first land pattern connected to the first terminal electrode, a second land pattern connected to the third terminal electrode, and a third land pattern connected in common to the second and fourth terminal electrodes.

12. The circuit substrate as claimed in claim 11, wherein the second and fourth terminal electrodes are short-circuited via a bridge of the solder.

13. A method for manufacturing a coil component, the method comprising:
preparing a drum-shaped core having a pair of flange portions and a winding core positioned between the pair of flange portions;
forming a plurality of terminal electrodes on each of the flange portions; and
winding a plurality of wires around the winding core and connecting end portions of the wire to the terminal electrodes, wherein each of the flange portions includes:
a mounting surface substantially parallel to an axial direction of the winding core; and
first and second side surfaces substantially parallel to the axial direction of the winding core and substantially parallel to each other, the mounting surface has a plurality of convex portions and at least one concave portion positioned between the plurality of convex portions, each of the terminal electrodes is formed at least on an associated one of the convex portions such that the terminal electrodes are isolated by the concave portion, the plurality of convex portions includes a first convex portion closest to the first side surface, the first convex portion having a third side surface that is substantially parallel to the first side surface, the plurality of convex portions includes a second convex portion closest to the second side surface, the second convex portion having a fourth side surface that is substantially parallel to the second side surface, a level difference between the first side surface and the third side surface is larger than a level difference between the second side surface and the fourth side surface, and the forming is performed by preparing an electrode material in a liquid or paste form and dipping the convex portions in the electrode material such that the concave portions is not brought into contact with the electrode material.

* * * * *